United States Patent
Wang

(10) Patent No.: US 10,394,098 B2
(45) Date of Patent: Aug. 27, 2019

(54) CONDUCTIVE PATTERN STRUCTURE AND ITS ARRAY SUBSTRATE AND DISPLAY DEVICE

(71) Applicant: BOE TECHNOLOGY GROUP CO., LTD., Beijing (CN)

(72) Inventor: Jianguo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/802,540

(22) Filed: Nov. 3, 2017

(65) Prior Publication Data

US 2018/0267376 A1   Sep. 20, 2018

(30) Foreign Application Priority Data

Mar. 17, 2017   (CN) .......................... 2017 1 0161607

(51) Int. Cl.
*H01L 23/532*   (2006.01)
*G02F 1/1362*   (2006.01)
*H01L 27/15*   (2006.01)

(52) U.S. Cl.
CPC .. *G02F 1/136277* (2013.01); *G02F 1/136286* (2013.01); *H01L 27/15* (2013.01); *G02F 2001/13629* (2013.01); *G02F 2001/136295* (2013.01); *H01L 23/53238* (2013.01)

(58) Field of Classification Search
CPC ............. H01L 23/532; H01L 23/53238; H01L 23/5322; H01L 27/15; G02F 1/136277; G02F 1/136286
See application file for complete search history.

(56) References Cited

U.S. PATENT DOCUMENTS

| 2001/0019892 A1* | 9/2001 | Komai | H01L 21/288 |
| | | | 438/687 |
| 2008/0053686 A1* | 3/2008 | Ishii | G11B 5/486 |
| | | | 174/255 |
| 2008/0073788 A1 | 3/2008 | Jeon | |

(Continued)

FOREIGN PATENT DOCUMENTS

| CN | 101136358 A | 3/2008 |
| CN | 102290451 A | 12/2011 |

(Continued)

OTHER PUBLICATIONS

First Chinese Office Action issued by the Chinese Patent Office dated Oct. 24, 2018.
Second Chinese Office Action dated May 13, 2019.

*Primary Examiner* — Phuc T Dang
(74) *Attorney, Agent, or Firm* — Dilworth & Barrese, LLP.; Michael J. Musella, Esq.

(57) ABSTRACT

A conductive pattern structure and its manufacturing method, an array substrate and a display device are provided. The conductive pattern structure includes a first metal layer and a second metal layer stacked in turn, wherein the second metal layer covers an upper surface and all side surfaces of the first metal layer, and the metal of the first metal layer has a stronger activity than the metal of the second metal layer. A common replacement reaction is adopted according to the order of the metal reducibility in the metal activity series table to cover an upper surface and all side surfaces of the first metal layer with the second metal layer.

8 Claims, 2 Drawing Sheets

(56) References Cited

U.S. PATENT DOCUMENTS

| | | |
|---|---|---|
| 2010/0320457 A1* | 12/2010 | Matsubara ............... C23F 1/02 257/43 |
| 2011/0308844 A1 | 12/2011 | Jeong et al. |
| 2012/0015152 A1* | 1/2012 | Takahashi ............. C04B 41/009 428/172 |
| 2012/0141820 A1 | 6/2012 | Chang et al. |
| 2012/0244377 A1 | 9/2012 | Chang et al. |
| 2012/0273963 A1* | 11/2012 | Mirsky ............... H01L 23/3735 257/774 |
| 2013/0161602 A1* | 6/2013 | James ................ H01L 51/0021 257/40 |
| 2014/0264875 A1 | 9/2014 | Kanki |
| 2016/0155714 A1 | 6/2016 | Hilsenbeck et al. |
| 2016/0254289 A1* | 9/2016 | Bai ..................... H01L 27/1248 257/72 |
| 2016/0293629 A1* | 10/2016 | Xiong ................. G02F 1/13394 |
| 2017/0005248 A1* | 1/2017 | Tomohiro ............. H01L 27/156 |
| 2017/0052418 A1* | 2/2017 | Zhang ................ G02F 1/136227 |
| 2017/0117503 A1* | 4/2017 | Harikrishna Mohan .................... H01L 51/5253 |

FOREIGN PATENT DOCUMENTS

| | | |
|---|---|---|
| CN | 102485959 A | 6/2012 |
| CN | 102691092 A | 9/2012 |
| CN | 104775064 A | 7/2015 |
| CN | 105655313 A | 6/2016 |

* cited by examiner

CONDUCTIVE PATTERN STRUCTURE AND ITS ARRAY SUBSTRATE AND DISPLAY DEVICE

The application claims priority of Chinese Patent Application No. 201710161607.1, filed on Mar. 17, 2017, the disclosure of which is incorporated herein by reference in its entirety as part of the present application.

TECHNICAL FIELD

Embodiments of the present disclosure relate to a conductive pattern structure and its manufacturing method, an array substrate and a display device.

BACKGROUND

At present, gate lines, gate electrodes, source electrodes, drain electrodes and data lines of thin film transistor liquid crystal displays (TFT-LCD) are generally made of Ta, Cr, Mo and other metals or metal alloys formed from the above mentioned metals which have relatively stable chemical properties and relatively high resistivities. Because of a smaller size and a lower resolution of the TFT-LCD, the delay of the gate signal is relatively small, which has no obvious effect on the display effect of the TFT-LCD. With the increasing of the size and resolution of the TFT-LCD, the length of the gate line increases, and thus the signal delay time increases as well. In a case that the signal delay increases to a certain extent, some pixels may not be fully charged, which may cause uneven brightness, so that the contrast of the TFT-LCD is reduced and the display quality of the image is seriously affected. Therefore, a low resistance metal may be used to manufacture the gate lines, the gate electrodes, the source electrodes, the drain electrodes and the data lines of thin film transistor liquid crystal displays to solve the above mentioned problem.

In a case that the metal lines or metal electrodes made of a low resistance metal are under high temperature condition, low resistance metal ions are prone to diffuse into the semiconductor layer, and the performance of the thin film transistor is deteriorated, which seriously affects the performance of the TFT.

SUMMARY

At least one embodiment of the present disclosure provides a conductive pattern structure which comprises: a first metal layer and a second metal layer stacked in turn, wherein the second metal layer covers an upper surface and all side surfaces of the first metal layer, and the metal of the first metal layer has a stronger activity than the metal of the second metal layer.

For example, in a conductive pattern structure provided by at least one embodiment of the present disclosure, the metal of the first metal layer comprises at least one of a copper-based metal and a silver-based metal.

For example, in a conductive pattern structure provided by at least one embodiment of the present disclosure, in a case that the metal of the first metal layer is the copper-based metal, the metal of the second metal layer comprises at least one of gold, silver, platinum and palladium; in a case that the metal of the first metal layer is the silver-based metal, the metal of the second metal layer comprises at least one of platinum and palladium.

For example, in a conductive pattern structure provided by at least one embodiment of the present disclosure, the copper-based metal comprises Cu, CuMo, CuTi, CuMoW, CuMoNb or CuMoTi; the silver-based metal comprises Ag, AgMo, AgTi, AgMoW, AgMoNb or AgMoTi.

For example, in a conductive pattern structure provided by at least one embodiment of the present disclosure, in the copper-based metal, a mass percentage of copper is from about 90 wt % to about 100 wt %; in the silver-based metal, a mass percentage of silver is from about 90 wt % to about 100 wt %.

For example, a conductive pattern structure provided by at least one embodiment of the present disclosure further comprises a buffer layer, wherein the first metal layer is disposed on the buffer layer, and the material of the buffer layer comprises at least one of Mo, Nb, Ti, MoW, MoNb, MoTi, WNb, WTi, TiNb, silicon nitride, silicon oxide and silicon oxynitride.

For example, in a conductive pattern structure provided by at least one embodiment of the present disclosure, the buffer layer has a thickness of from about 20 nm to about 30 nm, the first metal layer has a thickness of from about 200 nm to about 400 nm, and the second metal layer has a thickness of from about 10 nm to about 50 nm.

At least one embodiment of the present disclosure further provides an array substrate which comprises any one of the conductive pattern structures described above.

At least one embodiment of the present disclosure further provides a display device which comprises any one of the array substrates described above.

At least one embodiment of the present disclosure further provides a manufacturing method of a conductive pattern structure which comprises: depositing a first metal film on a base substrate; patterning the first metal film to form a first metal layer; placing the base substrate provided with the first metal layer in a compound solution containing second metal ions to form a second metal layer covering an upper surface and all side surfaces of the first metal layer.

For example, in a manufacturing method provided by at least one embodiment of the present disclosure, the metal of the first metal layer comprises at least one of a copper-based metal and a silver-based metal.

For example, in a manufacturing method provided by at least one embodiment of the present disclosure, in a case that the metal of the first metal layer is the copper-based metal, the metal of the second metal layer comprises at least one of gold, silver, platinum and palladium; in a case that the metal of the first metal layer is the silver-based metal, the metal of the second metal layer comprises at least one of platinum and palladium.

For example, in a manufacturing method provided by at least one embodiment of the present disclosure, in a case that the metal of the first metal layer is the copper-based metal, the compound solution containing the second metal ions comprises a platinum chloride solution, a platinum nitrate solution, a platinum sulfate solution, a palladium chloride solution, a palladium nitrate solution, a palladium sulfate solution, a silver nitrate solution or a gold trichloride solution; in a case that the metal of the first metal layer is the silver-based metal, the compound solution containing the second metal ions comprises a platinum chloride solution, a platinum nitrate solution, a platinum sulfate solution, a palladium chloride solution, a palladium nitrate solution or a palladium sulfate solution.

For example, a manufacturing method provided by at least one embodiment of the present disclosure, before depositing the first metal film on the base substrate, further comprises: forming a buffer film by a magnetron sputtering method or by a chemical vapor deposition method, and patterning the buffer film to form a buffer layer.

For example, in a manufacturing method provided by at least one embodiment of the present disclosure, a material of the buffer layer comprises at least one of Mo, Nb, Ti, MoW, MoNb, MoTi, WNb, WTi, TiNb, silicon nitride, silicon oxide and silicon oxynitride.

BRIEF DESCRIPTION OF THE DRAWINGS

In order to clearly illustrate the technical solution of the embodiments of the disclosure, the drawings of the embodiments will be briefly described in the following. It is apparent that the described drawings are only related to some embodiments of the disclosure and thus are not limitative of the disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Over," "under," "right," "left" and the like are only used to indicate relative position relationship, and when the position of the object which is described is changed, the relative position relationship may be changed accordingly.

In the manufacturing process of display devices, thin film transistors (TFTs) which have been industrialized at present mainly include those employing amorphous silicon, polycrystalline silicon, monocrystalline silicon, metal oxide or carbon nanotubes as the material of active layers. These thin film transistors usually use low resistance metals as the material of wires or metal electrodes. In a case that low resistance metal wires or low resistance metal electrodes are under high temperature conditions, low resistance metal ions are prone to diffuse into the semiconductor layer, so that the performance of the thin film transistor is deteriorated. In addition, the low resistance metal is also easily to be oxidized, which would affect the electrical conductivity of the metal wires and the metal electrodes. For the metal oxide thin film transistors, the phenomena of the metal ion diffusion and the metal oxidization are especially serious.

Figure 1:
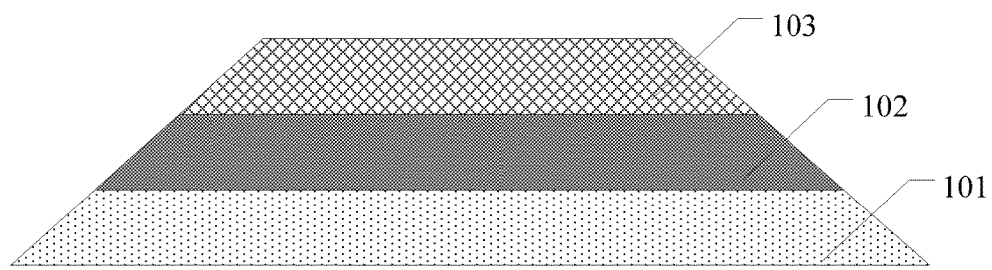
FIG. 1 schematically shows a cross section of a conductive pattern structure.

In general, a first buffer layer and a second buffer layer are formed on the upper side and the lower side of the low resistance metal to reduce the phenomenon that the metal ions diffuse into the semiconductor layer, and to prevent the low resistance metal from being oxidized. For example, FIG. 1 schematically shows a cross section of a conductive pattern structure. As illustrated in FIG. 1, the first buffer layer 101 and the second buffer layer 103 are formed on the upper side and the lower side of the low resistance metal 102. In the subsequent process of patterning the three-layered structure of the first buffer layer, the metal layer and the second buffer layer, because the second buffer layer 103 on the upper side of the metal layer has a poor adhesion ability with a photoresist, the photoresist is prone to fall off from the second buffer layer 103, and an etching liquid tends to flow between the second buffer layer 103 and the photoresist thereby causing the indentation of the second buffer layer 103. If the etching liquid further flows between the second buffer layer 103 and the low resistance metal 102, indentation of the low resistance metal 102 and breakage of the metal wires may also occur.

At least one embodiment of the present disclosure provides a conductive pattern structure which comprises: a first metal layer and a second metal layer stacked in turn, wherein the second metal layer covers an upper surface and all side surfaces of the first metal layer, and the metal of the first metal layer has a stronger activity than the metal of the second metal layer.

At least one embodiment of the present disclosure adopts a conventional replacement reaction according to the order of the metal reducibility in the metal activity series table to cover an upper surface and all side surfaces of the first metal layer with the second metal layer, thereby reducing the complexity of manufacturing the conductive pattern structure, and avoiding the phenomenon that the metal ions in the low resistance metal are prone to diffuse into the active layer to reduce the stability of the device and lead to the decline of the product yield. In addition, the problem of indentation of the second metal layer is avoided, so that the risk of indentation of the first metal layer and breakage of the metal wires is reduced.

Figure 2:
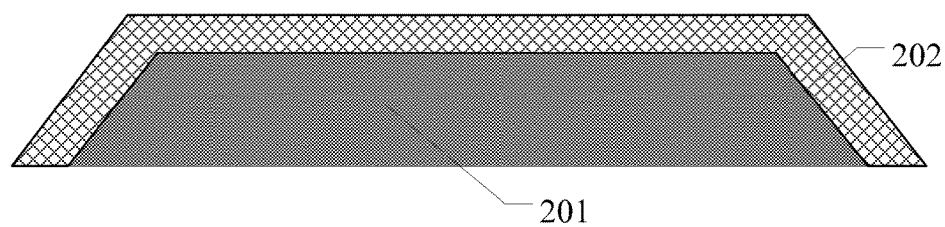
FIG. 2 schematically shows a cross section of a conductive pattern structure provided by an embodiment of the present disclosure.

At least one embodiment of the present disclosure provides a conductive pattern structure, for example, FIG. 2 schematically shows a cross section of a conductive pattern structure provided by an embodiment of the present disclosure. The conductive pattern structure 20 comprises a first metal layer 201 and a second metal layer 202 stacked in turn, wherein the second metal layer 202 covers an upper surface and all side surfaces of the first metal layer 201, and the metal of the first metal layer 201 has a stronger activity than the metal of the second metal layer 202.

It should be noted that, the activity of a metal refers to the flexibility of the metal to be displaced. According to the ranking in the metal activity series table, metals are arranged in order of their decreasing activity. The position of the metal of the first metal layer in the metal activity series table is in front of that of the metal of the second metal layer.

For example, the second metal layer 202 covers the upper surface and all the side surfaces of the first metal layer 201 to completely isolate the first metal layer 201 from the outside and further prevent the first metal layer 201 from being oxidized, thereby enhancing the conductivity of the first metal layer 201.

For example, the first metal layer is made of a low resistance metal. The low resistance metal comprises at least one of a copper-based metal and a silver-based metal, i.e., the low resistance metal comprises only the copper-based metal, or comprises only the silver-based metal, or comprises both the copper-based metal and the silver-based metal.

For example, the copper-based metal comprises Cu, CuMo, CuTi, CuMoW, CuMoNb or CuMoTi; and the silver-based metal comprises Ag, AgMo, AgTi, AgMoW, AgMoNb, or AgMoTi.

For example, a mass percentage of copper in the copper-based metal is from about 90 wt % to about 100 wt %, for instance is about 90 wt %, 92 wt %, 94 wt %, 96 wt %, 98 wt % or 100 wt %; a mass percentage of silver in the silver-based metal is from about 90 wt % to about 100 wt %, for instance is about 90 wt %, 92 wt %, 94 wt %, 96 wt %, 98 wt % or 100 wt %.

For example, according to the ranking in the metal activity series table, in a case that the metal of the first metal layer is the copper-based metal, the metal of the second metal layer comprises at least one of gold, silver, platinum and palladium; in a case that the metal of the first metal layer is the silver-based metal, the metal of the second metal layer comprises at least one of platinum and palladium.

For example, a portion of element copper or a portion of element silver can displace element platinum or element palladium out of a platinum chloride solution, a platinum nitrate solution, a platinum sulfate solution, a palladium chloride solution, a palladium nitrate solution or a palladium sulfate solution, and the displaced platinum or palladium is deposited on the upper surface and all the side surfaces of the first metal layer. The platinum chloride, platinum nitrate, platinum sulfate, palladium chloride, palladium nitrate or palladium sulfate solution, for example, is an aqueous solution of $PtCl_3$, $PtCl_4$, $Pt(NO_3)_2$ or $Pt(SO_4)_2$, or an aqueous solution of $PdCl_3$, $PdCl_4$, $Pd(NO_3)_2$ or $Pd(SO_4)_2$. Platinum or palladium is a metallic material with stable chemical properties, is insoluble in a strong acid solution or a strong alkaline solution, and is not readily to be oxidized in air. When the conductive pattern structure is applied in an array substrate, platinum or palladium is less liable to be oxidized or corroded in the subsequent chemical vapor deposition process and the subsequent annealing process during manufacturing the array substrate, thereby avoiding the yield reduction caused by oxidization and corrosion of the first metal layer made of copper or silver.

Of course, in a case that the first metal layer is made of copper, the second metal layer may be made of silver or gold with a relatively weak metal activity, and a corresponding salt solution may be an aqueous solution of $AgNO_3$ or $AuCl_3$. Such silver or gold metal layer has a good protective effect on the first metal layer.

In addition, for depositing a metallic film to form the second metal layer, conventional methods require a magnetron sputtering process, which has an expensive equipment cost and has to be conducted in a vacuum chamber. The replacement reaction method provided by at least one embodiment of the present disclosure gives a simple process of manufacturing the second metal layer on the upper surface and all the side surfaces of the first metal layer, and its cost is saved since harsh external conditions are not required.

Figure 3:
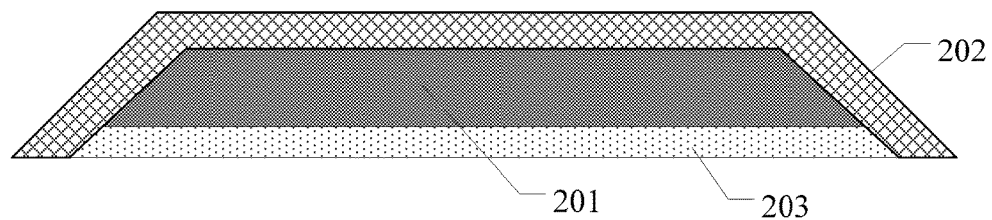
FIG. 3 schematically shows a cross section of another conductive pattern structure provided by an embodiment of the present disclosure.

For example, FIG. 3 schematically shows a cross section of another conductive pattern structure provided by an embodiment of the present disclosure. As illustrated in FIG. 3, the conductive pattern structure 20 further comprises a buffer layer 203 on which the first metal layer 201 is disposed. The buffer layer 203 is made of a metal or an inorganic nonmetal which is not easy to result in an ion diffusion phenomenon. For example, regarding the buffer layer 203, the metal comprises at least one of Mo, Nb, Ti, MoW, MoNb, MoTi, WNb, WTi and TiNb; and the inorganic nonmetal comprises at least one of silicon nitride, silicon oxide and silicon oxynitride. As illustrated in FIG. 3, the second metal layer 202 may be disposed on the side surfaces of the buffer layer 203.

For example, a thickness of the buffer layer is from about 20 nm to about 30 nm. For example, the thickness of the buffer layer is about 20 nm, 25 nm or 30 nm.

For example, a thickness of the first metal layer is from about 200 nm to about 400 nm. For example, the thickness of the first metal layer is about 200 nm, 250 nm, 300 nm, 350 nm or 400 nm.

For example, a thickness of the second metal layer is from about 10 nm to about 50 nm. For example, the thickness of the second metal layer is about 10 nm, 20 nm, 25 nm, 30 nm, 35 nm, 40 nm or 50 nm.

At least one embodiment of the present disclosure further provides an array substrate which comprises any one of the conductive pattern structures described above.

For example, the conductive pattern structure may be at least one of a gate electrode, a gate line, a first source drain electrode, a second source drain electrode, a data line and a common electrode line in an array substrate.

For example, the thin film transistor arranged on the array substrate may include an amorphous silicon thin film transistor, a polycrystalline silicon thin film transistor, a monocrystalline silicon thin film transistor, a metal oxide thin film transistor or a carbon nanotube thin film transistor. In general, the array substrate for manufacturing a display device is the metal oxide thin film transistor. The metal oxide thin film transistor has an advantage of high carrier mobility, so that the thin film transistor can be very small, thereby improving the resolution of the flat panel display and the display effect of the display device. Besides, the metal oxide thin film transistor also has the advantages of less uneven characteristics, low cost of materials and process, low process temperature, coating ability, high transparency of semiconductor layers and large band gap. The following takes a metal oxide thin film transistor which is of a bottom gate type as an example of the thin film transistor in the array substrate.

Figure 4:
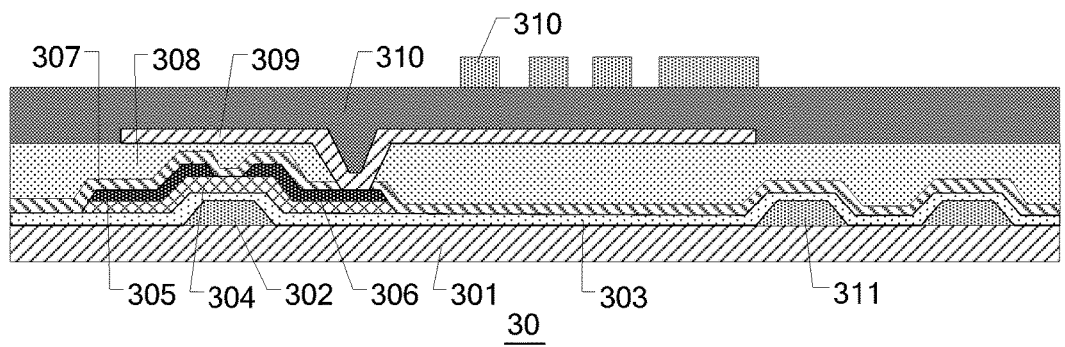
FIG. 4 schematically shows a cross section of an array substrate provided by an embodiment of the present disclosure.

For example, FIG. 4 schematically shows a cross section of an array substrate provided by an embodiment of the present disclosure. As illustrated in FIG. 4, the array substrate 30 comprises: a base substrate 301, and a gate electrode 302, a gate insulating layer 303, an active layer 304, a first source drain electrode 305, a second source drain electrode 306, an organic insulating layer 307, a passivation layer 308, a first electrode 309, a second electrode 310 and a common electrode line 311 which are arranged on the base substrate 301.

For example, the gate electrode 302, the gate line (not shown in FIG. 4), the first source drain electrode 305, the second source drain electrode 306, the data line (not shown in FIG. 4) and the common electrode line 311 in the array substrate 30 may be any one of the above mentioned conductive pattern structures. As such, the upper surface and all the side surfaces of the first metal layer (e.g., a copper metal layer or a silver metal layer) are covered with the second metal layer whose metal activity is relatively weak (for example, a platinum metal layer or a palladium metal layer), thereby avoiding the yield reduction caused by oxidization and corrosion of the first metal layer made of copper or silver. For example, platinum or palladium is a metallic material with stable chemical properties, is insoluble in a strong acid solution or a strong alkaline solution, and is not readily to be oxidized in air. During manufacturing the array substrate, platinum or palladium is less liable to be oxidized or corroded in the subsequent chemical vapor deposition process and the subsequent annealing process. Platinum or palladium has a good protective effect on the first metal layer. In addition, the cost of manufacturing the second metal layer is saved due to a low requirement for manufacture conditions.

Of course, in a case that the first metal layer is made of copper, the second metal layer may be made of silver or gold with a relatively weak metal activity, and the corresponding salt solution may be aqueous solution of $AgNO_3$ or $AuCl_3$. The silver or gold metal layer has a good protective effect on the first metal layer.

For example, the active layer 304 is of a metal oxide semiconductor, and the material of the active layer 304 comprises IGZO, HIZO, IZO, a-InZnO, ZnO, $In_2O_3$:Sn, $In_2O_3$:Mo, $Cd_2SnO_4$, ZnO:Al, $TiO_2$:Nb, or Cd—Sn—O.

For example, in at least one embodiment of the present disclosure, the material of the gate insulating layer 303 may comprise at least one of silicon oxide, silicon nitride and silicon oxynitride, and the gate insulating layer 303 may also be made of other inorganic materials which have the same or similar properties as the above mentioned materials.

For example, in at least one embodiment of the present disclosure, the base substrate 301 is a transparent insulating substrate, and is made of glass, quartz, plastics, or other suitable materials.

For example, in at least one embodiment of the present disclosure, the organic insulating layer 307 is made of at least one of polyimide, tetrafluoroethylene-perfluoroalkoxy vinyl ether copolymer, acrylic resin and polyethylene terephthalate.

For example, in at least one embodiment of the present disclosure, the passivation layer 308 is made of at least one of silicon nitride, silicon oxide, silicon oxynitride, titanium dioxide and aluminum oxide.

For example, in at least one embodiment of the present disclosure, the first electrode 309 is a pixel electrode, and the second electrode 310 is a common electrode; or the first electrode 309 is a common electrode, and the second electrode 310 is a pixel electrode.

For example, the first electrode 309 and the second electrode 310 may be made of a transparent conductive material or a metal material. For instance, the transparent conductive material comprises indium tin oxide (ITO), indium zinc oxide (IZO), indium gallium oxide (IGO), gallium zinc oxide (GZO), Zinc Oxide (ZnO), indium oxide ($In_2O_3$) aluminum zinc oxide (AZO) and carbon nanotubes. The metal material comprises silver, aluminum and so on.

For example, the order of forming the first electrode 309 and the second electrode 310 can be exchanged, which is not limited herein. In other words, the second electrode 310 may be arranged on the first electrode 309, or the first electrode 309 may be arranged on the second electrode 310.

Figure 5:
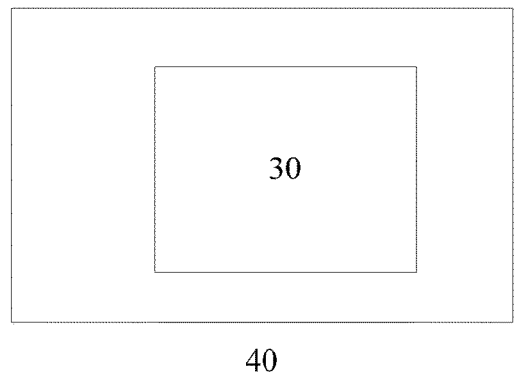
FIG. 5 is a block diagram of a display device provided by an embodiment of the present disclosure.

At least one embodiment of the present disclosure further provides a display device which comprises any one of the array substrates described above. FIG. 5 is a block diagram of a display device provided by an embodiment of the present disclosure. As illustrated in FIG. 5, the display device 40 comprises the array substrate 30.

For example, the display device 40 may be a liquid crystal display device, in which the array substrate and the opposing substrate are opposed to each other to form a liquid crystal cell filled with liquid crystal. The opposing substrate, for example, is a color filter substrate. The pixel electrode in each sub-pixel of the array substrate is configured to control the rotation degree of the liquid crystal material by applying an electric field so as to perform the display operation. In some examples, the liquid crystal display device further comprises a backlight source for providing backlight for the array substrate.

For another example, the display device may be an organic light-emitting diode (OLED) display device or an electronic paper display device.

For example, other structures of the display device 40 may refer to conventional designs. The display device may be: a mobile phone, a tablet computer, a television, a display, a notebook computer, a digital camera, a navigation system and any other product or component having a display function. It is apparent to those skilled in the field that the display device is provided with other essential components, which are not limited herein and may not be deemed as the limitation on the present invention. The implementation of the display device may refer to the embodiment of the organic electroluminescent device, which will not be described in detail herein for simplicity.

Figure 6:
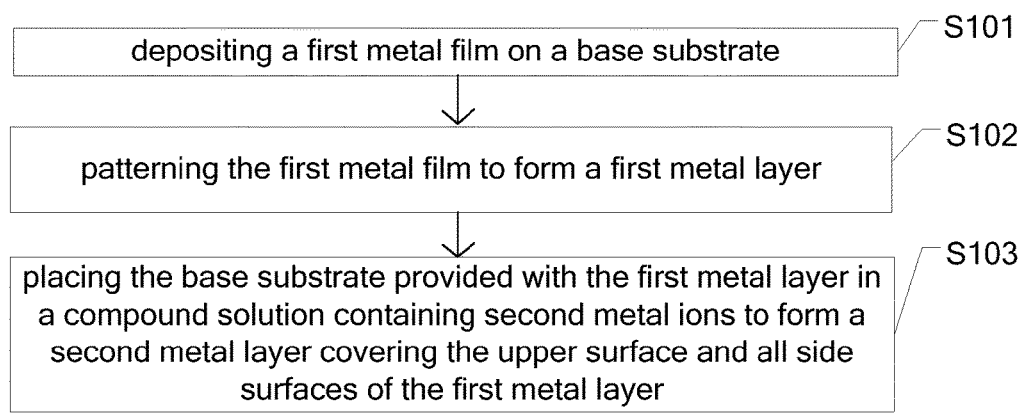
FIG. 6 is a flow diagram of a manufacturing method of a conductive pattern structure provided by an embodiment of the present disclosure.

At least one embodiment of the present disclosure further provides a manufacturing method of a conductive pattern structure. For example, FIG. 6 is a flow diagram showing a manufacturing method of a conductive pattern structure provided by an embodiment of the present disclosure. For example, the method comprises:

S101: depositing a first metal film on a base substrate.

For example, the base substrate is a transparent insulating substrate, and made of glass, quartz, plastics, or other suitable materials.

For example, the first metal film with a thickness of about 200 nm to about 400 nm is continuously deposited by a sputtering process or a thermal evaporation process. For instance, the thickness of the first metal layer is about 200 nm, 250 nm, 300 nm, 350 nm or 400 nm.

For example, the first metal film is made of a low resistance metal which comprises at least one of the copper-based metal and the silver-based metal. That is, the low resistance metal comprises only the copper-based metal, or comprises only the silver-based metal, or comprises both the copper-based metal and the silver-based metal.

For example, the copper-based metal comprises Cu, CuMo, CuTi, CuMoW, CuMoNb or CuMoTi; and the silver-based metal comprises Ag, AgMo, AgTi, AgMoW, AgMoNb, or AgMoTi.

For example, a mass percentage of copper in the copper-based metal is from about 90 wt % to about 100 wt %. For instance, the mass percentage of copper in the copper-based metal is about 90 wt %, 92 wt %, 94 wt %, 96 wt %, 98 wt % or 100 wt %. For example, a mass percentage of silver in the silver-based metal is from about 90 wt % to about 100 wt %. For instance, the mass percentage of silver in the silver-based metal is about 90 wt %, 92 wt %, 94 wt %, 96 wt %, 98 wt % or 100 wt %.

S102: patterning the first metal film to form a first metal layer.

For example, patterning the first metal film comprises: applying a layer of photoresist onto the first metal film; exposing the photoresist via a mask to form a photoresist removed region and a photoresist remaining region; subjecting to a developing process to remove the photoresist in the photoresist removed region without changing the thickness of the photoresist in the photoresist remaining region; completely removing the first metal film in the photoresist removed region by an etching process and then stripping off the remaining photoresist to form the first metal layer. The photoresist remaining region corresponds to the position of the first metal layer (for example, the gate electrode, the gate line, the first source drain electrode, the second source drain electrode, the data line or the common electrode line in the array substrate), and the photoresist removed region corresponds to the position outside the region of the first metal layer.

S103: placing the base substrate provided with the first metal layer in a compound solution containing second metal ions to form a second metal layer covering the upper surface and all side surfaces of the first metal layer.

For example, the second metal layer covers the upper surface and all the side surfaces of the first metal layer to completely isolate the first metal layer from the outside and further prevent the first metal layer from being oxidized, thereby enhancing the conductivity of the first metal layer.

For example, according to the ranking in the metal activity series table, in a case that the metal of the first metal layer is the copper-based metal, the metal of the second metal layer comprises at least one of gold, silver, platinum and palladium; in a case that the metal of the first metal layer is the silver-based metal, the metal of the second metal layer comprises at least one of platinum and palladium.

For example, a portion of element copper or a portion of element silver can displace element platinum or element palladium out of a platinum chloride solution, a platinum nitrate solution, a platinum sulfate solution, a palladium chloride solution, a palladium nitrate solution or a palladium sulfate solution, and the displaced platinum or palladium is deposited on the upper surface and all the side surfaces of the first metal layer. The platinum chloride, platinum nitrate, platinum sulfate, palladium chloride, palladium nitrate or palladium sulfate solution, for example, is an aqueous solution of $PtCl_3$, $PtCl_4$, $Pt(NO_3)_2$ or $Pt(SO_4)_2$, or an aqueous solution of $PdCl_3$, $PdCl_4$, $Pd(NO_3)_2$ or $Pd(SO_4)_2$. Platinum or palladium is a metallic material with stable chemical properties, is insoluble in a strong acid solution or a strong alkaline solution, and is not readily to be oxidized in air. When the conductive pattern structure is applied in an array substrate, platinum or palladium is less liable to be oxidized or corroded in the subsequent chemical vapor deposition process and the subsequent annealing process during manufacturing the array substrate, thereby avoiding the yield reduction caused by oxidization and corrosion of the first metal layer made of copper or silver.

Of course, in a case that the first metal layer is made of copper, the second metal layer may be made of silver or gold with a relatively weak metal activity, and a corresponding salt solution may be an aqueous solution of $AgNO_3$ or $AuCl_3$. Such silver or gold metal layer has a good protective effect on the first metal layer.

In addition, for depositing a metallic film to form the second metal layer, conventional methods require a magnetron sputtering process, which has an expensive equipment cost and has to be conducted in a vacuum chamber. The replacement reaction method provided by at least one embodiment of the present disclosure gives a simple process of manufacturing the second metal layer on the upper surface and all the side surfaces of the first metal layer, and its cost is saved since harsh external conditions are not required.

For example, before depositing the first metal film on the base substrate, the method further comprises: forming a buffer film by a magnetron sputtering process or by a chemical vapor deposition process, and patterning the buffer film to form a buffer layer.

For example, the process of depositing the buffer film comprises depositing a film of nitride, oxide or oxynitride continuously by a plasma enhanced chemical vapor deposition (PECVD) method, and then etching the film to form the buffer layer. The corresponding reaction gas is $SiH_4$, $NH_3$, $N_2$, $SiH_2Cl_2$ or $N_2$. The PECVD method has the advantages of low basic temperature, fast deposition rate, good film quality, few pinholes and less crazing.

For example, the material of the buffer layer comprises at least one of Mo, Nb, Ti, MoW, MoNb, MoTi, WNb, WTi, TiNb, silicon nitride, silicon oxide and silicon oxynitride.

For example, the thin film transistor in the array substrate provided by at least one embodiment of the present disclosure may be a bottom gate type thin film transistor, for example, a thin film transistor having an etch stop layer (ES) structure or a thin film transistor having a back channel etching (BCE) structure. Alternatively, the thin film transistor may be a top gate type thin film transistor or a double gate type thin film transistor.

The conductive pattern structure and its manufacturing method, the array substrate and the display device provided by at least one embodiment of the present disclosure have at least one of advantages as follows:

(1) The conductive pattern structure provided by at least one embodiment of the present disclosure adopts a common replacement reaction according to the order of the metal reducibility in the metal activity series table to cover the upper surface and all the side surfaces of the first metal layer with the second metal layer, thereby reducing the complexity of manufacturing the conductive pattern structure;

(2) The conductive pattern structure provided by at least one embodiment of the present disclosure avoids that the metal ions in the low resistance metal diffuse into the active layer to destroy the stability of the device;

(3) The conductive pattern structure provided by at least one embodiment of the present disclosure avoids the decline of the product yield;

(4) The conductive pattern structure provided by at least one embodiment of the present disclosure saves the cost since the replacement reaction has a low requirement for the equipment and external conditions.

The following points should be noted:

(i) The drawings of the present disclosure are only related to the structures described by some embodiments of the present disclosure, and other structures can be obtained on the basis of the illustrated embodiments by referring to general designs.

(ii) For clarity, in the drawings for describing the embodiments of the present disclosure, a thickness of a layer or a thickness of a region is exaggerated or reduced, that is, these drawings are not drawn according to an actual scale. It should be understood that: in a case that an element such as a layer, a film, a region or a substrate is referred to as being disposed "on" or "beneath" another element, the element may be "directly" disposed "on" or "beneath" another element, or an intermediate element may be provided.

(iii) In the absence of conflict, the embodiments of the present disclosure and the features in the embodiments can be combined with each other to obtain new embodiments.

What are described above is related to the illustrative embodiments of the disclosure only and not limitative to the scope of the disclosure. Therefore, the scopes of the disclosure are defined by the accompanying claims.

What is claimed is:

1. An array substrate, comprising a base substrate, a gate electrode, a gate insulating layer, an active layer, a first source drain electrode, a second source drain electrode, an organic insulating layer, a passivation layer, a first electrode, a second electrode, a gate line, a data line and a common electrode line, wherein one or more of the gate electrode, the gate line, the first source drain electrode, the second source drain electrode, the data line and the common electrode line in the array substrate is a conductive pattern structure comprising a first metal layer and a second metal layer stacked in turn, wherein the second metal layer covers an upper surface and all side surfaces of the first metal layer, and the metal of the first metal layer is the copper-based metal, and the metal of the second metal layer comprises at least one of gold, silver, platinum and palladium; or the metal of the first metal layer is the silver-based metal, and the metal of the second metal layer comprises at least one of platinum and palladium.

2. A display device, comprising the array substrate according to claim 1.

3. The array substrate according to claim 1, wherein the copper-based metal comprises Cu, CuMo, CuTi, CuMoW, CuMoNb or CuMoTi; the silver-based metal comprises Ag, AgMo, AgTi, AgMoW, AgMoNb or AgMoTi.

4. The array substrate according to claim 3, wherein a mass percentage of copper in the copper-based metal is from about 90 wt % to about 100 wt %; a mass percentage of silver in the silver-based metal is from about 90 wt % to about 100 wt %.

5. The array substrate according to claim 4, further comprising a buffer layer, wherein the first metal layer is disposed on the buffer layer, and the material of the buffer layer comprises at least one of Mo, Nb, Ti, MoW, MoNb, MoTi, WNb, WTi, TiNb, silicon nitride, silicon oxide and silicon oxynitride.

6. The array substrate according to claim 3, further comprising a buffer layer, wherein the first metal layer is disposed on the buffer layer, and the material of the buffer layer comprises at least one of Mo, Nb, Ti, MoW, MoNb, MoTi, WNb, WTi, TiNb, silicon nitride, silicon oxide and silicon oxynitride.

7. The array substrate according to claim 1, further comprising a buffer layer, wherein the first metal layer is disposed on the buffer layer, and the material of the buffer layer comprises at least one of Mo, Nb, Ti, MoW, MoNb, MoTi, WNb, WTi, TiNb, silicon nitride, silicon oxide and silicon oxynitride.

8. The array substrate according to claim 7, wherein the buffer layer has a thickness of from about 20 nm to about 30 nm, the first metal layer has a thickness of from about 200 nm to about 400 nm, and the second metal layer has a thickness of from about 10 nm to about 50 nm.

* * * * *